(12) United States Patent
Baker et al.

(10) Patent No.: US 11,563,434 B2
(45) Date of Patent: Jan. 24, 2023

(54) DIGITAL DRIVER USING AN ANALOG OPERATIONAL AMPLIFIER

(71) Applicant: Raytheon Company, Waltham, MA (US)

(72) Inventors: Paul Baker, Melissa, TX (US); Alvaro Flores, Allen, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/018,758

(22) Filed: Sep. 11, 2020

(65) Prior Publication Data

US 2022/0085813 A1     Mar. 17, 2022

(51) Int. Cl.
| | | |
|---|---|---|
| *H03K 5/24* | (2006.01) | |
| *H03K 19/0185* | (2006.01) | |
| *H03K 19/094* | (2006.01) | |
| *G11C 7/06* | (2006.01) | |

(52) U.S. Cl.
CPC ..... *H03K 19/018585* (2013.01); *G11C 7/062* (2013.01); *H03K 5/2481* (2013.01); *H03K 19/018571* (2013.01); *H03K 19/09429* (2013.01)

(58) Field of Classification Search
CPC ..... H03K 19/018585; H03K 19/09429; H03K 19/018571; H03K 5/2481; G11C 7/06; G11C 7/062
See application file for complete search history.

(56) References Cited

U.S. PATENT DOCUMENTS

| | | | | |
|---|---|---|---|---|
| 6,639,434 B1 * | 10/2003 | Rahman | ............... | H04L 25/0272 327/108 |
| 8,629,713 B2 * | 1/2014 | Pietri | ..................... | H03K 17/22 327/540 |
| 2007/0075776 A1 * | 4/2007 | Garlapati | ............ | H03F 3/45188 330/259 |

* cited by examiner

*Primary Examiner* — Jung Kim

(57) ABSTRACT

A driver circuit comprising a differential operational amplifier configured to receive an input voltage and produce a differential output voltage based at least in part on the input voltage. The differential output voltage can be produced for a receiver circuit that is communicatively coupled to the driver circuit.

14 Claims, 6 Drawing Sheets

DIGITAL DRIVER USING AN ANALOG OPERATIONAL AMPLIFIER

GOVERNMENT LICENSE RIGHTS

This invention was made with government support under government contract N00019-15-G-003 awarded by the United States of America Department of Defense. The government has certain rights to the invention.

BACKGROUND

Differential signaling technologies for high speed data transmissions include emitter coupled logic (ECL). ECL is a high-speed integrated circuit bipolar transistor logic family. ECL can use an overdriven bipolar junction transistor (BJT) differential amplifier with single-ended input and limited emitter current to avoid a saturated region of operation. ECL can operate with negative voltage supply. ECL can include positive ECL (PECL) and low voltage positive ECL (LVPECL). PECL can use a positive voltage supply instead of a negative voltage supply, as in ECL. LVPECL is a power-optimized version of PECL, in which a reduced positive voltage supply can be used. Other types of differential signaling technologies for high speed data transmissions include low voltage differential signaling (LVDS), current mode logic (CML), etc.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Figure 1:
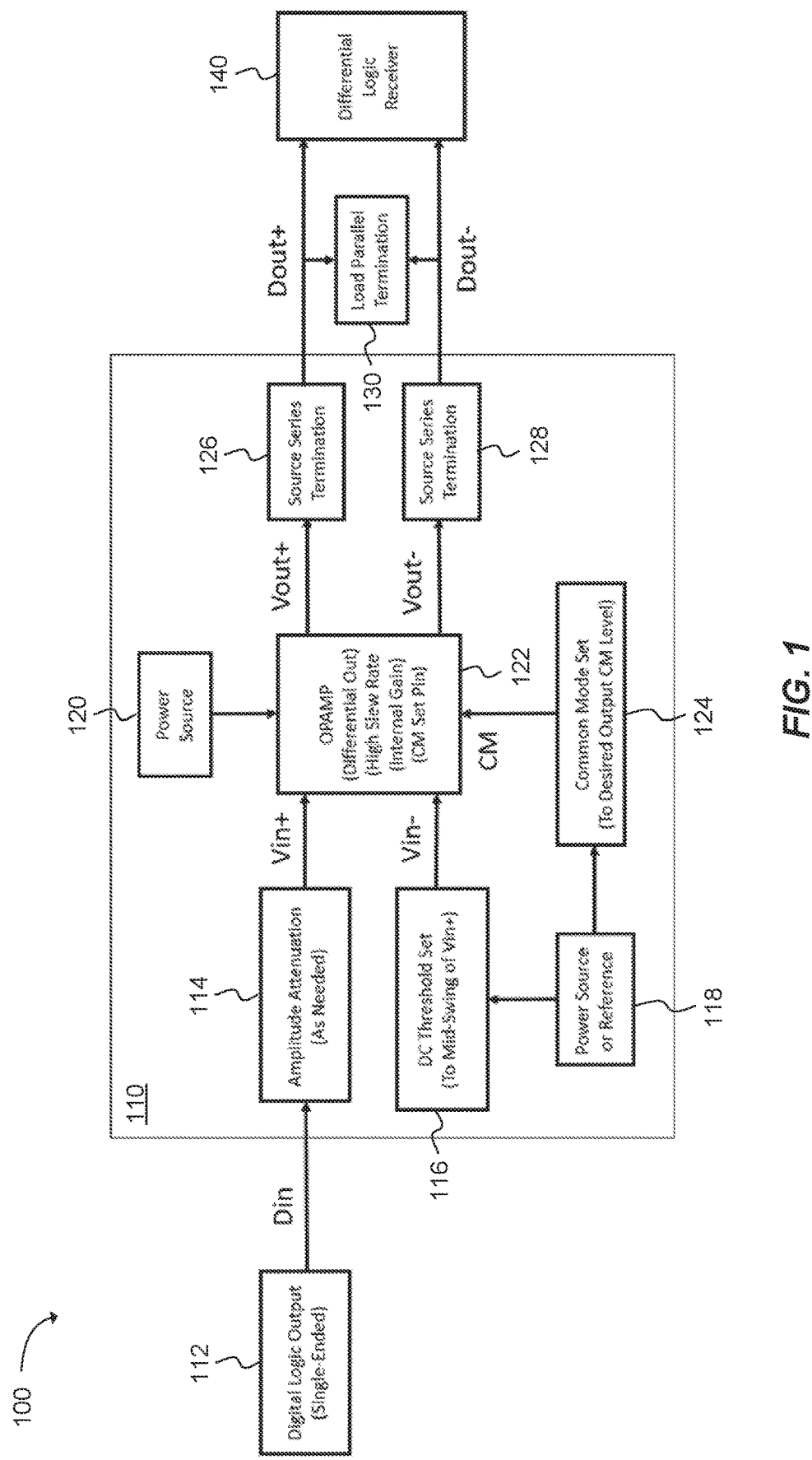
FIG. 1 illustrates a driver-receiver system in accordance with an example.

Reference will now be made to the exemplary embodiments illustrated, and specific language will be used herein to describe the same. It will nevertheless be understood that no limitation of the scope of the invention is thereby intended.

DETAILED DESCRIPTION

It is to be understood that the present disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

EXAMPLE EMBODIMENTS

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

ECL components are becoming more obsolete over time, and certain ECL components (e.g., ECL drivers) are being discontinued by manufacturers. When an ECL component breaks and is to be replaced, finding a replacement ECL component can be difficult since ECL components are being phased out by manufacturers and no longer produced. However, for a system that uses an ECL component (e.g., an ECL driver), replacing the ECL component that is no longer operational in the system may be more cost effective than replacing the system, redesigning various circuit boards in the system to not use ECL components, etc. However, with ECL components being phased out, replacing the ECL component with a new ECL component may not be possible. In this case, it may be desirable to create a suitable replacement component to replace the ECL component.

In accordance with the present disclosure, an ECL component (e.g., an ECL driver) may be replaced with a driver circuit. The driver circuit may utilize a differential operational amplifier with a common mode adjust pin. The differential operational amplifier may receive input voltage(s) and produce a differential output voltage based at least in part on the input voltage(s). The differential output voltage may be proportional to a difference between the input voltages. The differential output voltage may be provided to a receiver circuit that is communicatively coupled to the driver circuit. The differential operational amplifier, which is a traditionally analog component, can be used in this case to perform a digital function. In other words, the driver circuit can be a digital driver circuit that uses an analog operational amplifier, such as an analog differential operational amplifier. The driver circuit may produce a desired output voltage, which can be provided as an input to a receiver circuit. The driver circuit and the receiver circuit can be included in a wide variety of electronics, including but not limited to, video electronics.

In accordance with the present disclosure, the driver circuit may be used to replace an existing driver that utilizes ECL, PECL, LVPECL, LVDS, etc. For example, when the existing driver becomes inoperable, rather than replacing or redesigning an entire system that includes the existing driver, the existing driver may be replaced with the driver circuit described in the present technology.

FIG. 1 illustrates an example of a driver-receiver system 100. The driver-receiver system 100 can include a driver circuit 110 in communication with a receiver circuit 140. The receiver circuit 140 can also be referred to as a differential logic receiver. The driver circuit 110 can be associated with a high-speed differential logic type. The differential logic type associated with the driver circuit 110 can be ECL, PECL, LVPECL, LVDS, etc. In other words, the driver circuit 110 can be an ECL driver circuit, a PECL driver circuit, an LVPECL driver circuit, or an LVDS driver circuit. Similarly, the receiver circuit 140 can be associated with a differential logic type. The differential logic type associated with the receiver circuit 140 can be ECL, PECL, LVPECL, LVDS, etc. In other words, the receiver circuit 140 can be an ECL receiver circuit, a PECL receiver circuit, an LVPECL receiver circuit, or an LVDS receiver circuit.

In one example, a digital logic output 112 can be produced using a component (not shown). The digital logic output 112 can be a single-ended output. The digital logic output 112 can be provided as a driver logic input (Din) to the driver circuit 110.

In one example, the driver logic input can be used to produce an input voltage that is received at a differential operational amplifier 122 of the driver circuit 110. The input voltage received at the differential operational amplifier 122 can be based on the digital logic output. The input voltage can be a single-ended input voltage. The input voltage can include a positive input voltage (Vin+) and a negative input voltage (Vin−).

In one example, amplitude attenuation 114 can be applied to the driver logic input received at the driver circuit 110. In other words, an amplitude of the driver logic input can be attenuated or reduced, thereby producing the positive input voltage. The positive input voltage, as well as the negative input voltage, can be provided to the differential operational amplifier 122. The amplitude attenuation 114 can be a first voltage set point.

In one example, a first power source 120 can be coupled to the differential operational amplifier 122. The first power source 120 can provide a positive power source voltage and a negative power source voltage to the differential operational amplifier 122.

In one example, a second power source 118 (or reference source) can produce a positive voltage signal (which is different from the positive input voltage), which can be used to set a voltage threshold (as in block 116). In other words, the voltage threshold can be generated based on a voltage reference. The voltage threshold can be applied to the negative input voltage provided to the differential operational amplifier 122.

In one example, a differential swing across input(s) of the differential operational amplifier 122 can be equal to a desired differential swing at the receiver circuit 140.

As a non-limiting example, the differential swing can be approximately ±0.8V for ECL/PECL and approximately ±0.4V for LVDS logic. For ECL/PECL, the positive input terminal of the differential operational amplifier 122 can swing about ±0.8V about a voltage threshold for ECL/PECL. For LVDS logic, the positive input terminal of the differential operational amplifier 122 can swing about ±0.4V about a voltage threshold for LVDS logic. Thus, the voltage threshold for ECL/PECL can be set to approximately ±0.8V and the voltage level for LVDS logic can be set to approximately ±0.4V.

In one example, the positive input voltage can swing symmetrical about the voltage threshold. The symmetrical swing can be achieved using a voltage divider. In other words, the voltage threshold can be generated using the voltage divider.

As a non-limiting example, an approximately 0V to +1.6V swing for ECL/PECL can produce an approximately +0.8V swing about the voltage threshold of approximately +0.8V. In addition, an approximately 0V to +0.8V swing for LVDS logic can produce an approximately +0.4V swing about the voltage threshold of approximately +0.4V. In both cases, a symmetrical swing can be produced.

As another non-limiting example, for 3.3V complementary metal-oxide-semiconductor (CMOS) logic to ECL/PECL translation, the symmetrical swing can be obtained using a voltage divider that divides by two (e.g., by using two 150-ohm resistors). For 3.3V CMOS logic to LVDS logic translation, the symmetrical swing can be obtained using a voltage divider that divides by four. For other CMOS logic types, the voltage divider can be different. For example, for 2.5V CMOS to ECL/PECL translation, the symmetrical swing can be obtained using a voltage divider that divides by 1.5. For 1.8V CMOS to ECL/PECL translation, the symmetrical swing can be obtained using a voltage divider that divides by one. For 2.5V CMOS to LVDS logic translation, the symmetrical swing can be obtained using a voltage divider that divides by three. For 1.8V CMOS to LVDS logic translation, the symmetrical swing can be obtained using a voltage divider that divides by two.

In another non-limiting example, for ECL/PECL, a power rail of 5V can correspond to a voltage divider that divides by six. For ECL/PECL, a power rail of 3.3V can correspond to a voltage divider that divides by four. For ECL/PECL, a power rail of 2.5V can correspond to a voltage divider that divides by three. Similarly, for LVDS logic, voltage divider ratios can be determined for different power rails that are available (e.g., 5V, 3.3V, 2.5V, 1.8V and 1.5V).

In one example, the second power source 118 (or reference source) can produce a negative voltage signal, which can be used to set a common mode (CM) adjust pin of the differential operational amplifier 122 (as in block 124).

In one example, the differential operational amplifier 122 can be associated with an increased signal bandwidth, such as a 400 MHz large signal bandwidth, as an example. The differential operational amplifier 122 can be associated with an increased slew rate, such as a 2 volts per nanosecond slew rate, as an example. The differential operational amplifier 122 can provide a differential input and/or a differential output. The differential operational amplifier 122 can provide an internal fixed gain, such as an internal fixed gain of 6 decibels (dB), as an example. However, this is not intended to be limiting in any way as other internal fixed gains or gain levels are contemplated. In some cases, the differential operational amplifier 122 can include a selectable (or programmable) gain pin to provide a desired gain level. The differential operational amplifier 122 can include the common mode adjust pin 124 to adjust an output of the differential operational amplifier 122. The common mode adjust pin 124 can be a second voltage set point.

In one example, the differential operational amplifier 122 in the driver circuit 110 can receive the input voltage (e.g., the positive input voltage and the negative input voltage). The differential operational amplifier 122 can produce a differential output voltage based on the input voltage. The differential output voltage can be produced based on the internal fixed gain of the differential operational amplifier 122 or a programmable gain of the differential operational amplifier 122. The differential output voltage can include a positive differential output voltage (Vout+), as well as a negative differential output voltage (Vout−).

In one example, the common mode adjust pin of the differential operational amplifier 122 can apply an offset (e.g., a voltage offset) to the differential output voltage. The offset applied to the differential output voltage can be based on the differential logic type associated with the driver circuit 110. In other words, the offset can depend on whether the driver circuit 110 is an ECL driver circuit, a PECL driver circuit, an LVPECL driver circuit, or an LVDS driver circuit.

In one example, a voltage applied to the common mode adjust pin can produce a desired output common mode level.

As a non-limiting example, for ECL, the common mode can be approximately −1.3V, and the common mode adjust pin can be set to approximately −1.3V. For PECL, the common mode can be approximately +3.65V, and the common mode adjust pin can be set to approximately +3.65V.

For LVDS logic, the common mode can be approximately +1.25V, and the common mode adjust pin can be set to approximately +1.25V. In one example, a power rail with an appropriate voltage divider or a voltage reference can be used to create these voltages.

In one example, the positive differential output voltage from the differential operational amplifier 122 can be provided to a first source series termination 126. The negative differential output voltage from the differential operational amplifier 122 can be provided to a second source series termination 128. A positive driver logic output (Dout+) can be (or can be derived from) the positive differential output voltage, and a negative driver logic output (Dout−) can be (or can be derived from) the negative differential output voltage. The positive driver logic output and the negative driver logic output can be coupled to a load parallel termination 130. The positive driver logic output and the negative driver logic output can be provided to the receiver circuit 140. In other words, the receiver circuit 140 can receive the differential output voltage, which includes the positive differential output voltage and the negative differential output voltage, outputted by the differential operational amplifier 122.

In one configuration, lower amplitude differential logic (e.g., LVDS) can be converted to high amplitude differential logic (e.g., ECL/PECL), when a selected differential operational amplifier has a sufficient internal gain. For example, an internal gain of 12 dB, together with an impedance matching gain of −6 dB can result in a combined gain of 6 dB. A combined gain of 6 dB can be sufficient for converting LVDS logic to ECL/PECL logic.

In one configuration, alternating current (AC)-coupled drive logic can be used with a differential operational amplifier with correct biasing. In this configuration, a 50% duty cycle, a single-ended clock and biasing at 0V potential can be employed. Here, 0V can be applied to a negative input of the differential operational amplifier (e.g., the voltage threshold), and an attenuated AC-coupled input can be applied to a positive input of the differential operational amplifier. This configuration can be a special case of the single-ended drive input approach.

In one configuration, when AC-coupled drive logic is used with a differential operational amplifier, a 50% differential clock can be biased by applying attenuated AC-coupled signals to a positive input of the differential operational amplifier and a negative input of the differential operational amplifier. This configuration can be a special case of the complementary-drive input approach.

Figure 2:
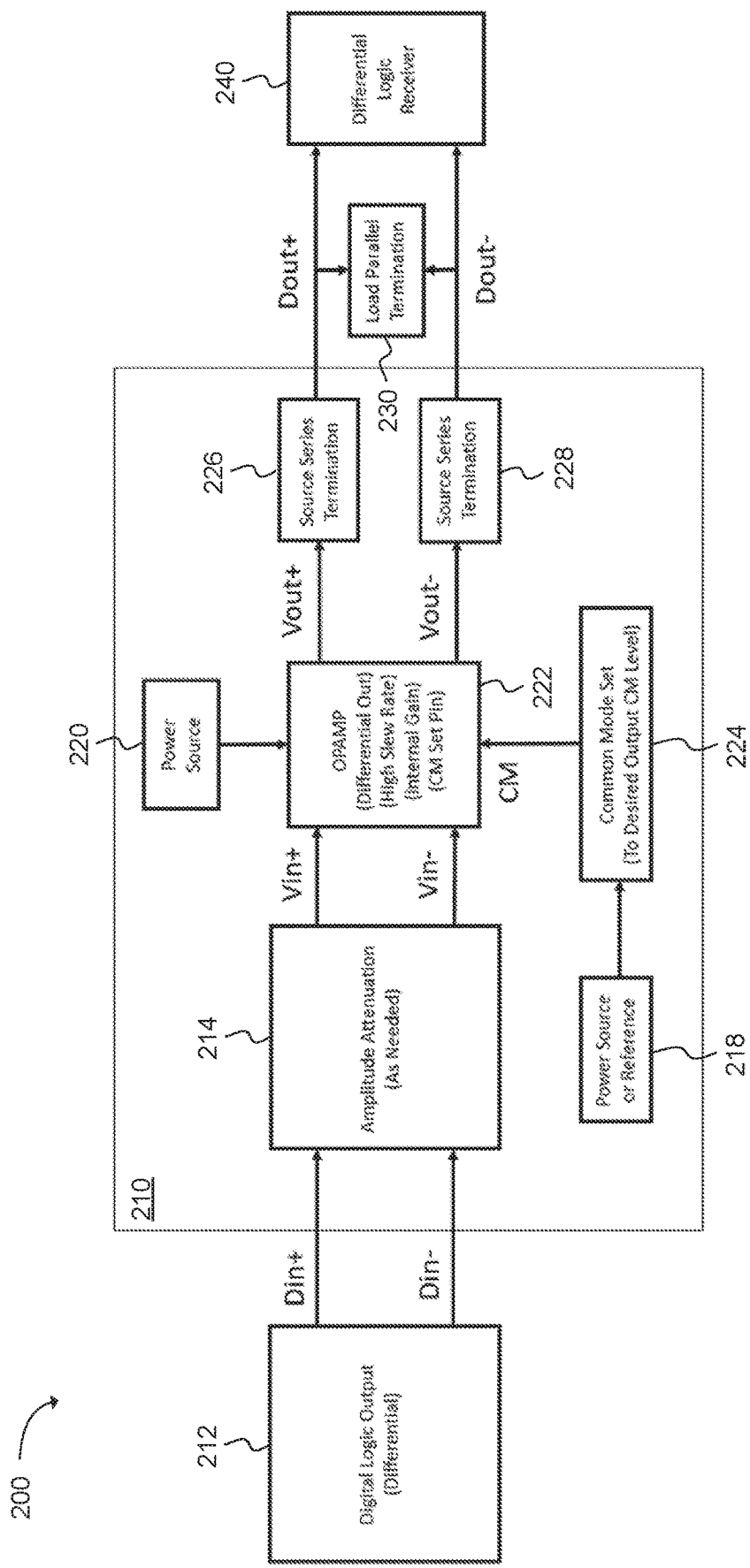
FIG. 2 illustrates a driver-receiver system in accordance with an example.

FIG. 2 illustrates an example of a driver-receiver system 200. The driver-receiver system 200 can include a driver circuit 210 in communication with a receiver circuit 240. The receiver circuit 240 can also be referred to as a differential logic receiver. The driver circuit 210 can be associated with a high-speed differential logic type. The differential logic type associated with the driver circuit 210 can be ECL, PECL, LVPECL, LVDS, etc. In other words, the driver circuit 210 can be an ECL driver circuit, a PECL driver circuit, an LVPECL driver circuit, or an LVDS driver circuit. Similarly, the receiver circuit 240 can be associated with a differential logic type. The differential logic type associated with the receiver circuit 240 can be ECL, PECL, LVPECL, LVDS, etc. In other words, the receiver circuit 240 can be an ECL receiver circuit, a PECL receiver circuit, an LVPECL receiver circuit, or an LVDS receiver circuit.

In one example, a digital logic output 212 can be produced using a component (not shown). The digital logic output 212 can be a differential output. The digital logic output 212 can be provided as a positive driver logic input (Din+) and a negative driver logic input (Din−) to the driver circuit 210.

In this example, the digital logic output 212 can form a complementary drive input. In other words, the positive driver logic input and the negative driver logic input can be complementary driver logic inputs.

In one example, the positive driver logic input can be used to produce a positive input voltage (Vin+) that is received at a differential operational amplifier 222 of the driver circuit 210. The positive input voltage received at the differential operational amplifier 222 can be based on the digital logic output. The positive input voltage can be a differential input voltage. Similarly, the negative driver logic input can be used to produce a negative input voltage (Vin−) that is received at the differential operational amplifier 222 of the driver circuit 210. The negative input voltage received at the differential operational amplifier 222 can be based on the digital logic output. The negative input voltage can be a differential input voltage.

In one example, amplitude attenuation 214 can be applied to the positive driver logic input and the negative driver logic input received at the driver circuit 210. In other words, an amplitude of the positive driver logic input and/or the negative driver logic input can be attenuated or reduced, thereby producing the positive input voltage and the negative input voltage, respectively. The positive input voltage and the negative input voltage can be provided to the differential operational amplifier 122.

In one example, a first power source 220 can be coupled to the differential operational amplifier 222. The first power source 220 can provide a positive power source voltage and a negative power source voltage to the differential operational amplifier 222.

In one example, the driver circuit 210 does not perform threshold level tuning, as the driver circuit 210 can be naturally balanced. For example, positive differential and negative differential swings for output(s) of the differential operational amplifier 222 can remain equal, which can result in differential levels and single ended levels being within certain limits even when parameters of the driver circuit 210 drift.

In one example, the driver circuit 210 can include an input voltage divider stage. As non-limiting examples, 3.3V CMOS to ECL/PECL translation can correspond to a voltage divider that divides by four, 2.5V CMOS to ECL/PECL translation can correspond to a voltage divider that divides by three, 1.8V CMOS to ECL/PECL translation can correspond to a voltage divider that divides by two, 3.3V CMOS to LVDS translation can correspond to a voltage divider that divides by eight, 2.5V CMOS to LVDS translation can correspond to a voltage divider that divides by six, and 1.8V CMOS to LVDS translation can correspond to a voltage divider that divides by four.

In one example, the differential operational amplifier 222 in the driver circuit 210 can receive the input voltage (e.g., the positive input voltage and the negative input voltage). The differential operational amplifier 222 can produce a differential output voltage based on the input voltage. The differential output voltage can be produced based on an internal fixed gain of the differential operational amplifier 222 or a programmable gain of the differential operational amplifier 222. The differential output voltage can include a positive differential output voltage (Vout+), as well as a negative differential output voltage (Vout−).

In one example, a second power source 118 (or reference source) can produce a negative voltage signal (which is different from the negative input voltage). The negative voltage signal can be used to set a common mode (CM) adjust pin of the differential operational amplifier 222 (as in block 224). The common mode adjust pin can apply an offset (e.g., a voltage offset) to the differential output voltage. The offset applied to the differential output voltage can be based on the differential logic type associated with the driver circuit 210. In other words, the offset can depend on whether the driver circuit 210 is an ECL driver circuit, a PECL driver circuit, an LVPECL driver circuit, or an LVDS driver circuit.

In one example, a voltage applied to the common mode adjust pin can produce a desired output common mode level.

As a non-limiting example, for ECL, the common mode can be approximately −1.3V, and the common mode adjust pin can be set to approximately −1.3V. For PECL, the common mode can be approximately +3.65V, and the common mode adjust pin can be set to approximately +3.65V. For LVPECL, the common mode can be approximately +2.0V, and the common mode adjust pin can be set to approximately +2.0V. For LVDS logic, the common mode can be approximately +1.25V, and the common mode adjust pin can be set to approximately +1.25V. In one example, a power rail with an appropriate voltage divider or a voltage reference can be used to create these voltages. In some cases, 0V common mode differential output logic types can be used for improved balance and electromagnetic inference (EMI) rejection.

In one example, the positive differential output voltage from the differential operational amplifier 222 can be provided to a first source series termination 226. The negative differential output voltage from the differential operational amplifier 222 can be provided to a second source series termination 228. A positive driver logic output (Dout+) can be (or can be derived from) the positive differential output voltage, and a negative driver logic output (Dout−) can be (or can be derived from) the negative differential output voltage. The positive driver logic output and the negative driver logic output can be coupled to a load parallel termination 230. The positive driver logic output and the negative driver logic output can be provided to the receiver circuit 240. In other words, the receiver circuit 240 can receive the differential output voltage, which includes the positive differential output voltage and the negative differential output voltage, outputted by the differential operational amplifier 222.

In one example, one advantage of complementary driver logic inputs, as shown in FIG. 2, is that complementary differential swing can be double that of single-ended swing, so faster drive logic can be used for an internal gain for a given differential operational amplifier.

Figure 3:
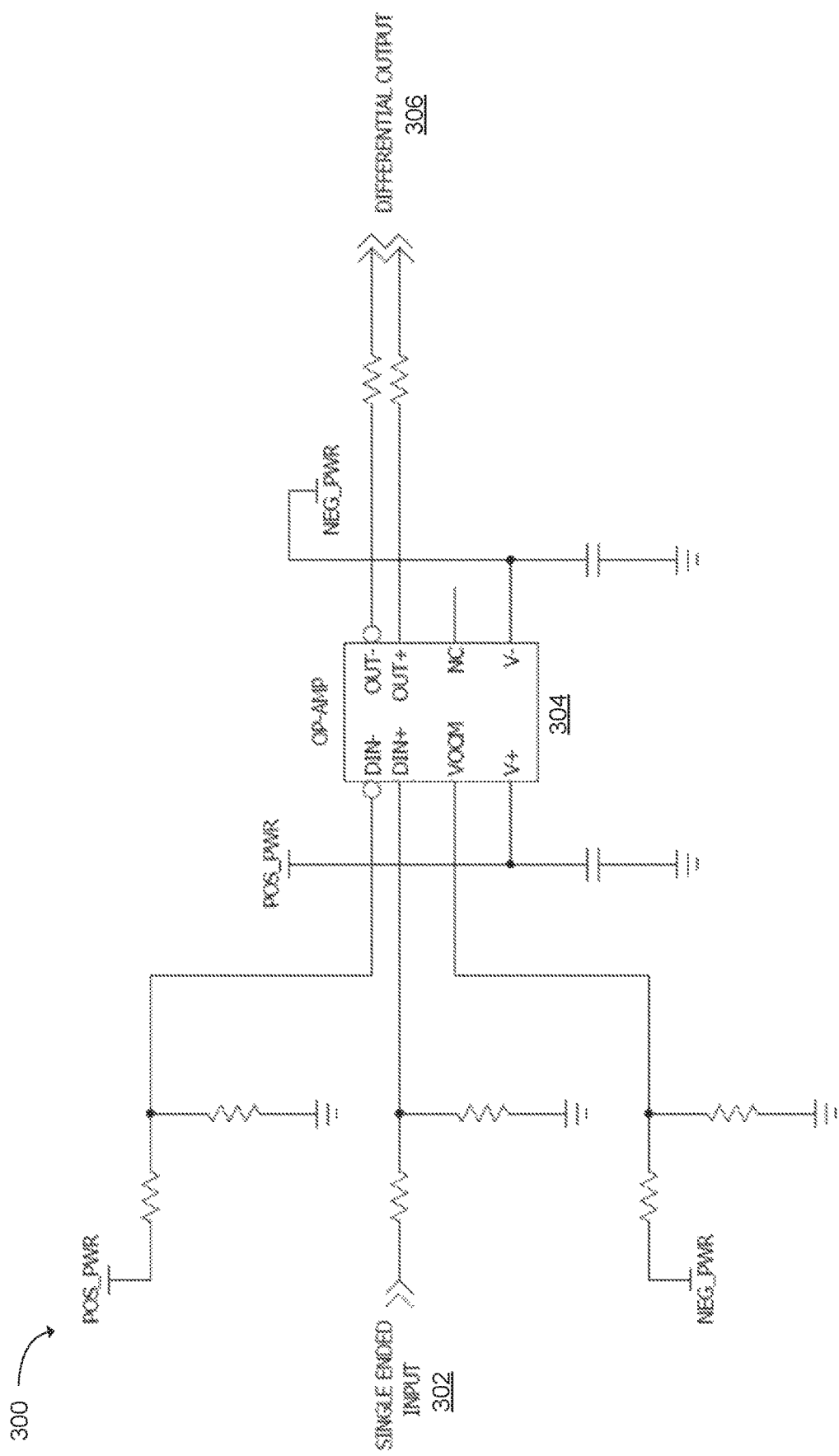
FIG. 3 is a diagram illustrating a driver circuit in accordance with an example.

FIG. 3 illustrates an example of a driver circuit 300. The driver circuit 300 may be a specific example of the driver circuit 110, as described above. The driver circuit 300 may receive a single ended input voltage 302. The single ended input voltage 302 can be provided to a Din+ pin of a differential operational amplifier 304. In other words, a single drive line can be used to feed the differential operational amplifier 304. A positive power voltage can be provided to a Din− pin of the differential operational amplifier 304. A negative power voltage can be provided to a voltage output common mode (VOCM) pin of the differential operational amplifier 304. A positive power voltage can be provided to a positive voltage (V+) pin of the differential operational amplifier 304, and a negative power voltage can be provided to a negative voltage (V−) pin of the differential operational amplifier 304. The differential operational amplifier 304 may or may not include a not connected (NC) pin. In some cases, the differential operational amplifier 304 may include zero, one, two, etc. NC pin(s). The differential operational amplifier 304 can include a negative output (Out−) pin and a positive output (Out+) pin that produce a differential output voltage 306.

In one example, the driver circuit 300 can include two single ended voltage dividers. For example, the driver circuit 300 can include a first single ended voltage divider for the Din+ pin, and the driver circuit 300 can include a second single ended voltage divider for the Din− pin. The two single ended voltage dividers can be resistor dividers. Alternatively, the two single ended voltage dividers can be replaced by a voltage set point formed by other circuits, such as a circuit with a Zener reference diode.

Figure 4:
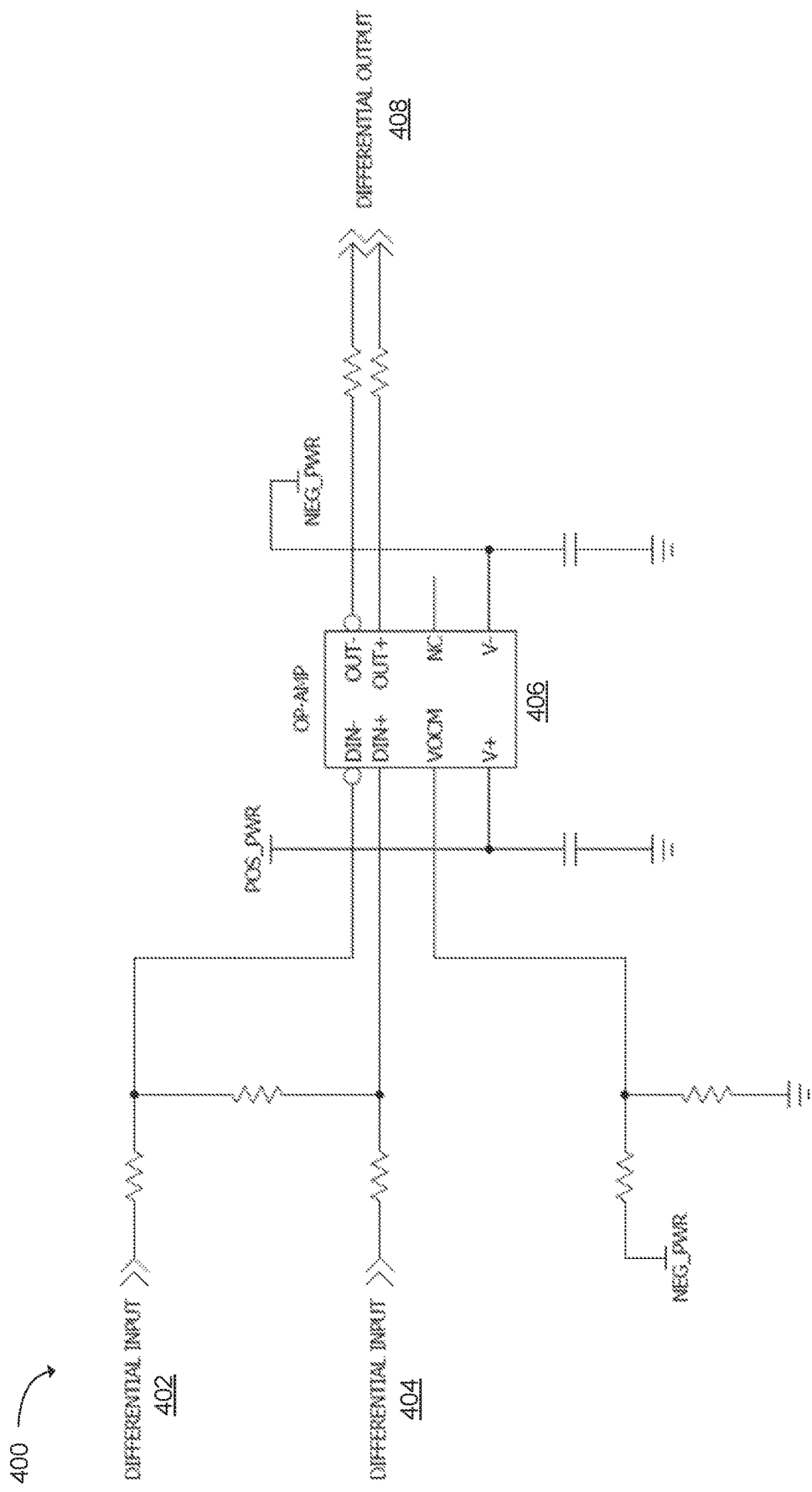
FIG. 4 is a diagram illustrating a driver circuit in accordance with an example.

FIG. 4 illustrates an example of a driver circuit 400. The driver circuit 400 may be a specific example of the driver circuit 210, as described above. The driver circuit 400 may receive a first differential input voltage 402 and a second differential input voltage 404. The first differential input voltage 402 and the second differential input voltage 404 can be complementary differential input voltages. The first differential input voltage 402 can be provided to a Din− pin of a differential operational amplifier 406. The second differential input voltage 404 can be provided to a Din+ pin of the differential operational amplifier 406. In other words, two driver lines can be used to feed the differential operational amplifier 406. A negative power voltage can be provided to a VOCM pin of the differential operational amplifier 406. A positive power voltage can be provided to a V+ pin of the differential operational amplifier 406, and a negative power voltage can be provided to a V− pin of the differential operational amplifier 406. The differential operational amplifier 406 may or may not include an NC pin. The differential operational amplifier 406 can include an Out− pin and an Out+ pin that produce a differential output voltage 408.

In one example, the driver circuit 400 can include a single differential voltage divider across a first drive line that corresponds to the first differential input voltage 402 and a second drive line that corresponds to the second differential input voltage 404. The single differential voltage divider can potentially reduce a number of resistors in the driver circuit 400, as compared to using two separate single ended voltage dividers. The single differential voltage divider can be a resistor divider. Alternatively, the single differential voltage divider can be replaced by a voltage set point formed by other circuits, such as a circuit with a Zener reference diode.

Figure 5:
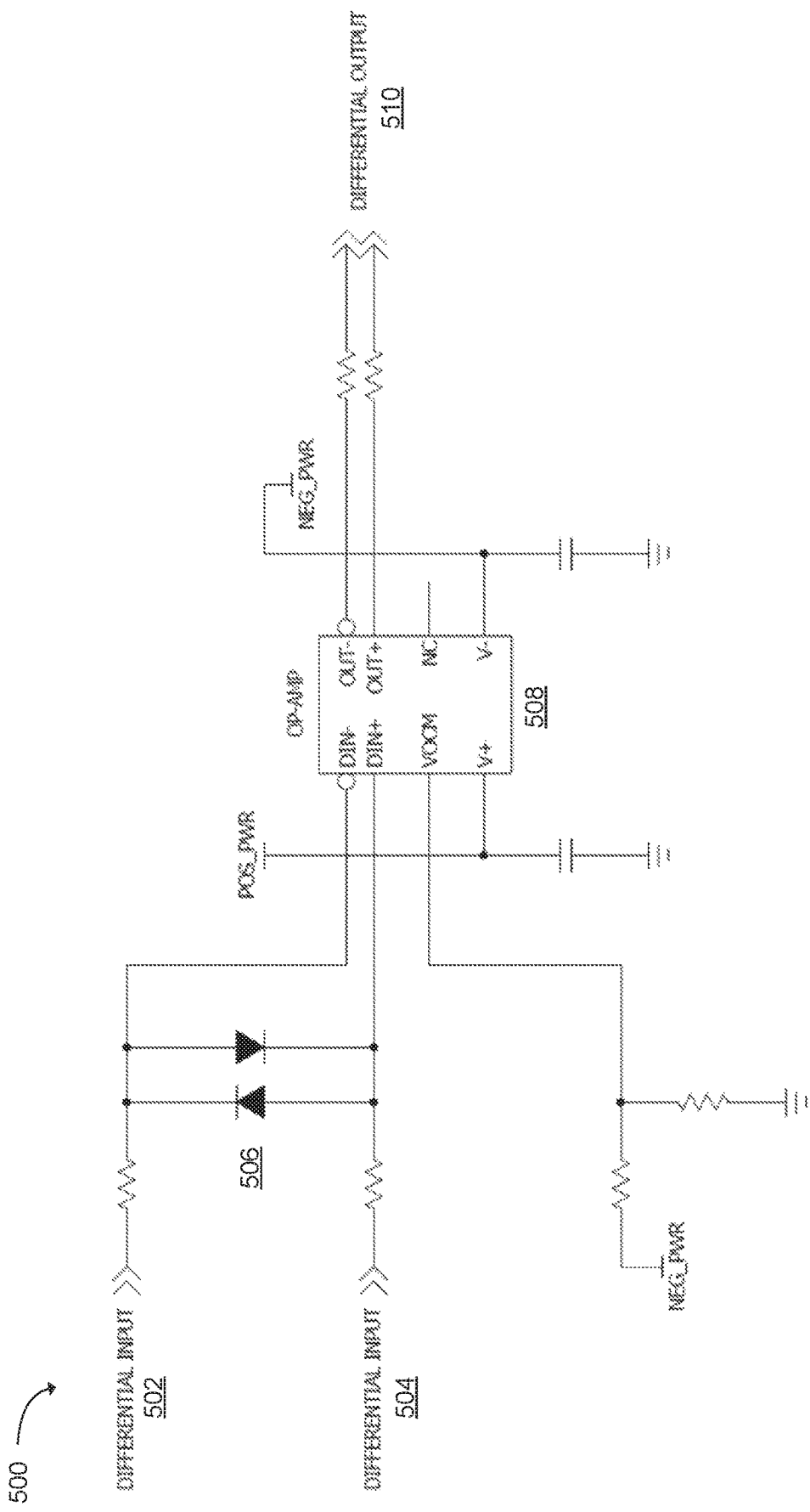
FIG. 5 is a diagram illustrating a driver circuit in accordance with an example.

FIG. 5 illustrates an example of a driver circuit 500. The driver circuit 500 may be a specific example of the driver circuit 210, as described above. The driver circuit 500 may receive a first differential input voltage 502 and a second differential input voltage 504. The first differential input voltage 502 and the second differential input voltage 504 can be complementary differential input voltages. The first differential input voltage 502 can be provided to a Din− pin of a differential operational amplifier 508. The second differential input voltage 504 can be provided to a Din+ pin of the differential operational amplifier 508. A negative power voltage can be provided to a VOCM pin of the differential operational amplifier 508. A positive power voltage can be provided to a V+ pin of the differential operational amplifier 508, and a negative power voltage can be provided to a V− pin of the differential operational amplifier 508. The differential operational amplifier 508 may or may not include an NC pin. The differential operational amplifier 508 can include an Out− pin and an Out+ pin that produce a differential output voltage 510.

Figure 6:
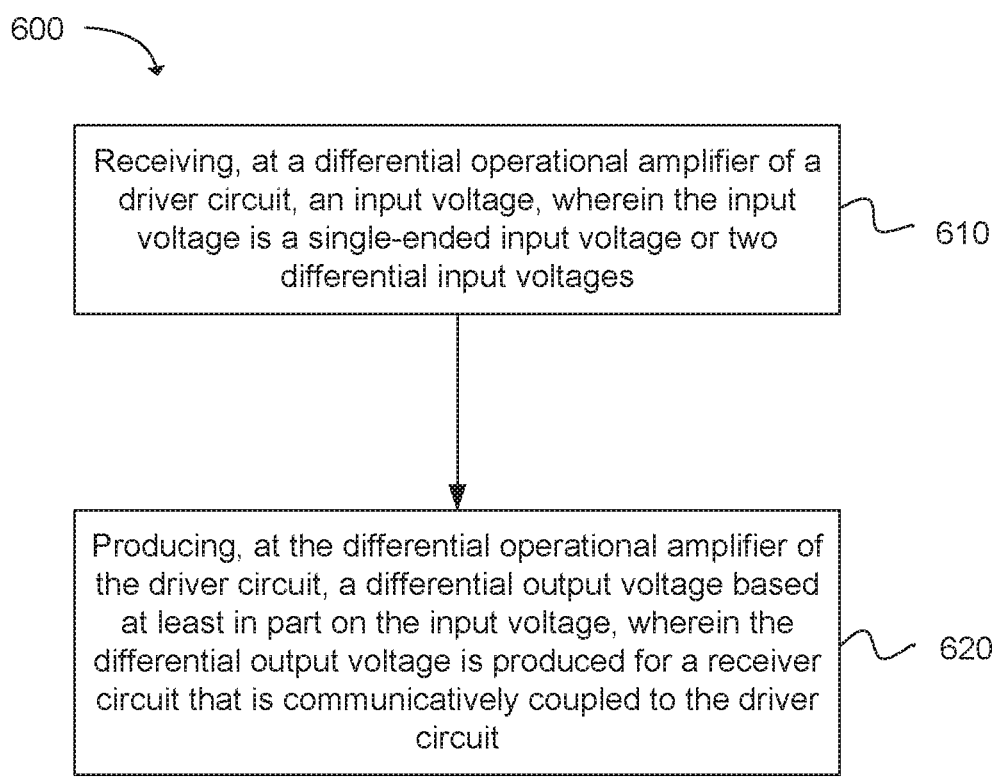
FIG. 6 depicts a method for generating a differential output voltage in accordance with an example.

In this example, the driver circuit 500 can include a pair of diodes between a first drive line that corresponds to the first differential input voltage 502 and a second drive line that corresponds to the second differential input voltage 504. In this example, the pair of diodes can be used instead of a single differential voltage divider or two separate single ended voltage dividers, FIG. 6 illustrates a flowchart of a method for generating a differential voltage. The method can include receiving, at a differential operational amplifier of a driver circuit, an input voltage, wherein the input voltage is a single-ended input voltage or two differential input voltages, as in block 610. The method can include producing, at the differential operational amplifier of the driver circuit, a differential output voltage based at least in part on the input voltage, wherein the differential output voltage is produced for a receiver circuit that is communicatively coupled to the driver circuit, as in block 620.

Reference was made to the examples illustrated in the drawings, and specific language was used herein to describe the same. It will nevertheless be understood that no limitation of the scope of the technology is thereby intended. Alterations and further modifications of the features illustrated herein, and additional applications of the examples as illustrated herein, which would occur to one skilled in the relevant art and having possession of this disclosure, are to be considered within the scope of the description.

Furthermore, the described features, structures, or characteristics may be combined in any suitable manner in one or more examples. In the preceding description, numerous specific details were provided, such as examples of various configurations to provide a thorough understanding of examples of the described technology. One skilled in the relevant art will recognize, however, that the technology can be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements can be devised without departing from the spirit and scope of the described technology.

What is claimed is:

1. A driver-receiver system, comprising:
   a driver circuit comprising a differential operational amplifier configured to: receive an input voltage based at least in part on a digital logic output, and produce a differential output voltage based at least in part on the input voltage,
   wherein the driver circuit is associated with a differential logic type, wherein the differential logic type is one of: emitter-coupled logic (ECL), positive emitter-coupled logic (PECL), or low voltage positive emitter-coupled logic (LVPECL), and
   wherein the differential operational amplifier includes a common mode adjust pin configured to apply an offset to the differential output voltage, wherein the offset applied to the differential output voltage is based at least in part on the differential logic type associated with the driver circuit;
   a receiver circuit communicatively coupled to the driver circuit, wherein the receiver circuit is configured to receive the differential output voltage from the driver circuit; and
   a single differential voltage divider when the input voltage includes two differential input voltages, wherein the single differential voltage divider is configured to produce a symmetric differential swing across the two differential input voltages that is based at least in part on the differential logic type associated with the driver circuit.

2. The driver-receiver system of claim 1, wherein the input voltage is a single-ended input voltage.

3. The driver-receiver system of claim 1, wherein the input voltage includes two differential input voltages.

4. The driver-receiver system of claim 1, wherein the digital logic output is a single-ended output or a differential output.

5. The driver-receiver system of claim 1, further comprising a power source to provide a power source voltage to the differential operational amplifier.

6. The driver-receiver system of claim 1, wherein the differential operational amplifier is configured to produce the differential output voltage based at least in part on one of an internal fixed gain of the differential operational amplifier or a programmable gain of the differential operational amplifier.

7. The driver-receiver system of claim 1, further comprising two single-ended voltage dividers when the input voltage is a single-ended input voltage.

8. The driver-receiver system of claim 1, wherein the single differential voltage divider comprises at least one of a resistor or a pair of diodes.

9. A driver circuit, comprising:
   a differential operational amplifier configured to: receive an input voltage based at least in part on a digital logic output, and produce a differential output voltage based at least in part on the input voltage, wherein the differential output voltage is produced for a receiver circuit that is communicatively coupled to the driver circuit,
   wherein the driver circuit is associated with a differential logic type, wherein the differential logic type is one of: emitter-coupled logic (ECL), or positive emitter-coupled logic (PECL), and
   wherein the differential operational amplifier includes a common mode adjust pin configured to apply an offset to the differential output voltage, wherein the offset is based at least in part on a differential logic type associated with the driver circuit; and
   a single differential voltage divider when the input voltage includes two differential input voltages, wherein the single differential voltage divider is configured to produce a symmetric differential swing across the two differential input voltages that is based at least in part on the differential logic type associated with the driver circuit.

10. The driver circuit of claim 9, wherein:
    the input voltage includes two differential input voltages.

11. The driver circuit of claim 9, wherein the digital logic output is a differential output.

12. The driver circuit of claim 9, further comprising a single differential voltage divider when the input voltage includes two differential input voltages.

13. A method for generating a differential output voltage, comprising:

receiving, at a differential operational amplifier of a driver circuit, an input voltage based at least in part on a digital logic output, wherein the input voltage is a single-ended input voltage or two differential input voltages; and producing, at the differential operational amplifier of the driver circuit, the differential output voltage based at least in part on the input voltage, wherein the driver circuit is associated with a differential logic type, wherein the differential logic type is one of: emitter-coupled logic (ECL), positive emitter-coupled logic (PECL), or low voltage positive emitter-coupled logic (LVPECL), and wherein the differential operational amplifier includes a common mode adjust pin configured to apply an offset to the differential output voltage, and wherein the offset is based at least in part on a differential logic type associated with the driver circuit, and wherein the differential output voltage is produced for a receiver circuit that is communicatively coupled to the driver circuit, and wherein the differential operational amplifier includes a single differential voltage divider when the input voltage includes two differential input voltages, wherein the single differential voltage divider is configured to produce a symmetric differential swing across the two differential input voltages that is based at least in part on the differential logic type associated with the driver circuit.

14. The method of claim 13, wherein the digital logic output is a differential output.

\* \* \* \* \*